United States Patent
Cao et al.

(10) Patent No.: US 10,692,950 B2
(45) Date of Patent: Jun. 23, 2020

(54) OLED DISPLAY PANEL HAVING A FIRST BARRIER CLOSED RING AND A SECOND BARRIER CLOSED RING

(71) Applicant: WUHAN CHINA STAR OPTOELECTRONICS SEMICONDUCTOR DISPLAY TECHNOLOGY CO., LTD., Wuhan, Hubei (CN)

(72) Inventors: Jun Cao, Hubei (CN); Hsianglun Hsu, Hubei (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 16/308,612

(22) PCT Filed: Oct. 12, 2018

(86) PCT No.: PCT/CN2018/109994
§ 371 (c)(1),
(2) Date: Dec. 10, 2018

(87) PCT Pub. No.: WO2020/042288
PCT Pub. Date: Mar. 5, 2020

(65) Prior Publication Data
US 2020/0075700 A1  Mar. 5, 2020

(30) Foreign Application Priority Data
Aug. 31, 2018 (CN) .......................... 2018 1 1010398

(51) Int. Cl.
H01L 27/32 (2006.01)
H01L 51/52 (2006.01)
H01L 51/56 (2006.01)

(52) U.S. Cl.
CPC ...... *H01L 27/3262* (2013.01); *H01L 27/3258* (2013.01); *H01L 51/5253* (2013.01); *H01L 51/56* (2013.01); *H01L 2227/323* (2013.01)

(58) Field of Classification Search
CPC ............. H01L 27/3258; H01L 27/3262; H01L 27/3272; H01L 51/5253; H01L 51/56; H01L 2227/323
See application file for complete search history.

(56) References Cited

U.S. PATENT DOCUMENTS

2016/0284770 A1  9/2016  Kim
2018/0138451 A1  5/2018  Kim
(Continued)

FOREIGN PATENT DOCUMENTS

CN  106158881 A  11/2016
CN  106409869 A   2/2017
CN  207637803 U   7/2018

*Primary Examiner* — Hoai V Pham
(74) *Attorney, Agent, or Firm* — Muncy, Geissler, Olds & Lowe, P.C.

(57) ABSTRACT

An OLED display panel and manufacturing method thereof. The OLED display panel includes a TFT array substrate, organic light emitting units, a first barrier, a second barrier, a trench, and a thin film packaging structure. The first barrier and the second barrier are disposed in a non-display region. The trench is formed corresponding to the position of a gap between the first barrier and the second barrier. The trench is disposed in an insulating layer stacked structure of the TFT array substrate. The thin film packaging structure covers above elements. The trench is disposed in a straight-edge region and a height difference is formed between the straight-edge region and a corner region. This can efficiently (Continued)

lower the risk of overflow from the corner region to the outside for an organic layer of the thin film packaging structure.

14 Claims, 7 Drawing Sheets

(56) References Cited

U.S. PATENT DOCUMENTS

2018/0205037 A1   7/2018  Kim et al.
2019/0288234 A1*  9/2019  Kim .................... H01L 51/5246

* cited by examiner

OLED DISPLAY PANEL HAVING A FIRST BARRIER CLOSED RING AND A SECOND BARRIER CLOSED RING

FIELD OF THE DISCLOSURE

The present application relates to display technologies, and more particularly, to an organic light emitting diode (OLED) display panel and manufacturing method thereof.

DESCRIPTION OF RELATED ARTS

Compared to liquid crystal displays (LCDs), a great advantage of OLED displays is that flexibility is achieved by the OLED displays. However, OLED devices are sensitive to oxygen and moisture. In order to avoid invasion of oxygen and moisture and achieve flexibility a thin film packaging structure is used to package the OLED devices in traditional processes.

Generally, the thin film packaging structure is constructed by overlapped organic layers and inorganic layers. The organic layers of the thin film packaging structure have a certain degree of ability to flow. In order to confine the organic layers in certain regions, one or more dams are usually formed in peripheral areas of a display region.

FIG. 1 is a schematic diagram showing an existing OLED display panel 100. As shown in FIG. 1, the display panel 100 is divided into a non-display region D and a display region E. A barrier 110 is disposed in the non-display region D. Boundary of the organic layers of the thin film packaging structure is defined by the barrier 110.

FIG. 2 is a schematic diagram illustrating an existing special-shaped screen 200. Referring to FIGS. 1 and 2, the barrier 100 is a closed ring structure having a straight-edge region SR and a corner region CR. The barrier shown in FIG. 1 has four corner regions CR. The number of the corner regions CR in the special-shaped screen 200 shown in FIG. 2 is large and their profiles are more complicated.

Since the shape of the corner region CR is more complicated than the shape of the straight-edge region SR, a problem caused in the existing prior arts is that the organic layers of the thin film packaging structure may overflow from the corner region CR, resulting invasion of oxygen and moisture. The OLED devices cannot yield a good oxygen and moisture proof. Lifetime of the OLED devices decreases. Since the special-shaped screen 200 has a large number of the corner regions CR, it is more serious in overflow of the organic layers of the thin film packaging structure.

TECHNICAL PROBLEMS

An objective of the present application is to provide an OLED display panel and manufacturing method thereof, for lowering the risk of overflow of an organic layer of a thin film packaging structure.

TECHNICAL SOLUTIONS

To achieve above objective, an aspect of the present application provides an OLED display panel, including a display region and a non-display region, the display region configured to display images, the non-display region surrounding the display region, the display panel including: a TFT array substrate, including an insulating layer stacked structure in the non-display region, the insulating layer stacked structure including a plurality of overlapped insulating layers; a plurality of organic light emitting units, disposed on the TFT array substrate and located in the display region; a first barrier, disposed on the TFT array substrate, the first barrier located in the non-display region and surrounding the display region; a second barrier disposed on the TFT array substrate, the second barrier located in the non-display region and surrounding the first barrier, the first barrier and the second barrier distanced away from each other, the first barrier including a first closed ring structure, the second barrier including a second closed ring structure, the first closed ring structure disposed inside the second closed ring structure, the first barrier and the second barrier constructing a ring structure, a straight-edge region and a corner region defined on the ring structure; a trench, disposed in the straight-edge region of the ring structure and between the first closed ring structure and the second closed ring structure, the trench disposed in the insulating layer stacked structure of the TFT array substrate and having an exposed opening, a height of the TFT array substrate in the straight-edge region lower than a height of the TFT array substrate in the corner region; and a thin film packaging structure, having one or more organic layers and one or more inorganic layers that are overlapped, the thin film packaging structure covering the TFT array substrate, the plural organic light emitting units, the first barrier, the second barrier, and the exposed opening of the trench in the straight-edge region disposed on the ring structure.

In an embodiment of the present application, the plural insulating layers contained in the insulating layer stacked structure of the TFT array substrate sequentially include a gate insulating layer, a first insulating interlayer, and a second insulating interlayer, and the second insulating interlayer is a outmost insulating layer of the insulating layer stacked structure.

In an embodiment of the present application, a depth of the trench is equal to a thickness of the second insulating interlayer.

In an embodiment of the present application, a depth of the trench is equal to a total thickness of the first insulating interlayer and the second insulating interlayer.

In an embodiment of the present application, a depth of the trench is equal to a total thickness of the gate insulating layer, the first insulating interlayer, and the second insulating interlayer.

Another aspect of the present application is to provide an OLED display panel, including a display region and a non-display region, the display region configured to display images, the non-display region surrounding the display region, the display panel including: a TFT array substrate, including an insulating layer stacked structure in the non-display region, the insulating layer stacked structure including a plurality of overlapped insulating layers; a plurality of organic light emitting units, disposed on the TFT array substrate and located in the display region; a first barrier, disposed on the TFT array substrate, the first barrier located in the non-display region and surrounding the display region; a second barrier, disposed on the TFT array substrate, the second barrier located in the non-display region and surrounding the first barrier, the first barrier and the second barrier distanced away from each other, the first barrier and the second barrier constructing a ring structure, a straight-edge region and a corner region defined on the ring structure; a trench, disposed in the straight-edge region of the ring structure and located between the first barrier and second barrier, the trench disposed in the insulating layer stacked structure of the TFT array substrate and having an exposed opening; and a thin film packaging structure, having one or more organic layers and one or more inorganic layers that are overlapped, the thin film packaging structure covering the TFT array substrate, the plural organic light emitting units, the first barrier, the second barrier, and the exposed opening of the trench in the straight-edge region disposed on the ring structure.

In an embodiment of the present application, the first barrier includes a first closed ring structure, the second barrier includes a second closed ring structure, the first closed ring structure is disposed inside the second closed ring structure, the trench is disposed between the first closed ring structure and the second closed ring structure.

In an embodiment of the present application, a height of the TFT array substrate in the straight-edge region is lower than a height of the TFT array substrate in the corner region.

In an embodiment of the present application, the trench has a side wall and a bottom wall, the side wall and the bottom wall of the trench are adjacent to at least one of the plural insulating layers of the insulating layer stacked structure.

In an embodiment of the present application, the trench has a side wall and a bottom wall, the side wall of the trench is adjacent to one of the plural insulating layers of the insulating layer stacked structure and the bottom wall of the trench is adjacent to another one of the plural insulating layers of the insulating layer stacked structure.

In an embodiment of the present application, the plural insulating layers contained in the insulating layer stacked structure of the TFT array substrate sequentially include a gate insulating layer, a first insulating interlayer, and a second insulating interlayer, and the second insulating interlayer is a outmost insulating layer of the insulating layer stacked structure.

In an embodiment of the present application, a depth of the trench is equal to a thickness of the second insulating interlayer.

In an embodiment of the present application, a depth of the trench is equal to a total thickness of the first insulating interlayer and the second insulating interlayer.

In an embodiment of the present application, a depth of the trench is equal to a total thickness of the gate insulating layer, the first insulating interlayer, and the second insulating interlayer.

Still another aspect of the present application is to provide a method for manufacturing an OLED display panel, the display panel including a display region and a non-display region, the display region configured to display images, the non-display region surrounding the display region, the method including: forming a TFT array substrate, the TFT array substrate including an insulating layer stacked structure in the non-display region, the insulating layer stacked structure including a plurality of overlapped insulating layers; disposing a plurality of organic light emitting units on the TFT array substrate in the display region; removing at least one of the plural insulating layers contained in the insulating layer stacked structure of the TFT array substrate in the non-display region to form a trench, the trench having an exposed opening; disposing a first barrier and a second barrier on the TFT array substrate in the non-display region, the first barrier and the second barrier constructing a ring structure, a straight-edge region and a corner region defined on the ring structure, the trench disposed in the straight-edge region of the ring structure and located between the first barrier and the second barrier; forming a thin film packaging structure having one or more organic layers and one or more inorganic layers that are overlapped, to cover the TFT array substrate, the plural organic light emitting units, the first barrier, the second barrier, and the exposed opening of the trench in the straight-edge region disposed on the ring structure.

In an embodiment of the present application, the first barrier includes a first closed ring structure, the second barrier includes a second closed ring structure, the first closed ring structure is disposed inside the second closed ring structure, the trench is disposed between the first closed ring structure and the second closed ring structure.

In an embodiment of the present application, a height of the TFT array substrate in the straight-edge region is lower than a height of the TFT array substrate in the corner region.

In an embodiment of the present application, the plural insulating layers contained in the insulating layer stacked structure of the TFT array substrate sequentially include a gate insulating layer, a first insulating interlayer, and a second insulating interlayer, and the second insulating interlayer is a outmost insulating layer of the insulating layer stacked structure.

In an embodiment of the present application, a depth of the trench is equal to a thickness of the second insulating interlayer.

In an embodiment of the present application, a depth of the trench is equal to a total thickness of the first insulating interlayer and the second insulating interlayer.

BENEFICIAL EFFECTS

In the present application, a trench is disposed in the straight-edge region on the TFT array substrate at the position of the gap between the two barriers and. This makes the height of the TFT array substrate in the straight-edge region lower than the height of the TFT array substrate in the corner region. That is, a height difference of the TFT array substrate is formed between the straight-edge region and the corner region. When the organic layer of the thin film packaging structure overflows from the corner region to a region between the two barriers, the overflowed portion may be distributed to the straight-edge region with low height due to the height difference. Accordingly, the present application can efficiently lower the risk of overflow from the corner region to the outside for an organic layer of the thin film packaging structure.

DESCRIPTION OF DRAWINGS

To make above content of the present application more easily understood, it will be described in details by using preferred embodiments in conjunction with the appending drawings.

DESCRIPTION OF EMBODIMENTS OF THE DISCLOSURE

To make the objectives, technical schemes, and effects of the present application more clear and specific, the present application is described in further detail below with reference to the embodiments in accompanying with the appending drawings. It should be understood that the specific embodiments described herein are merely for explaining the present application, the term "embodiment" used in the context means an example, instance, or illustration, and the present application is not limited thereto.

Figure 1:
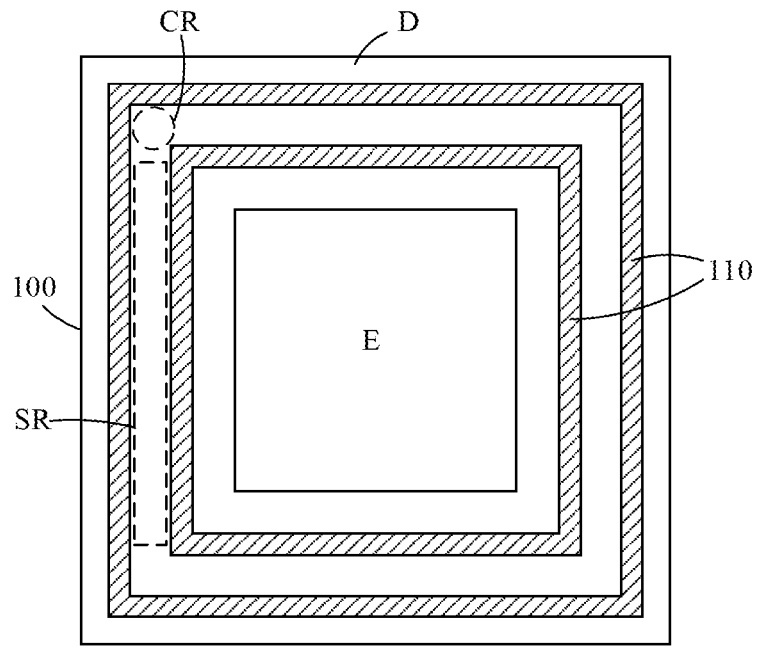
FIG. 1 is a schematic diagram showing an existing OLED display panel.
Figure 2:
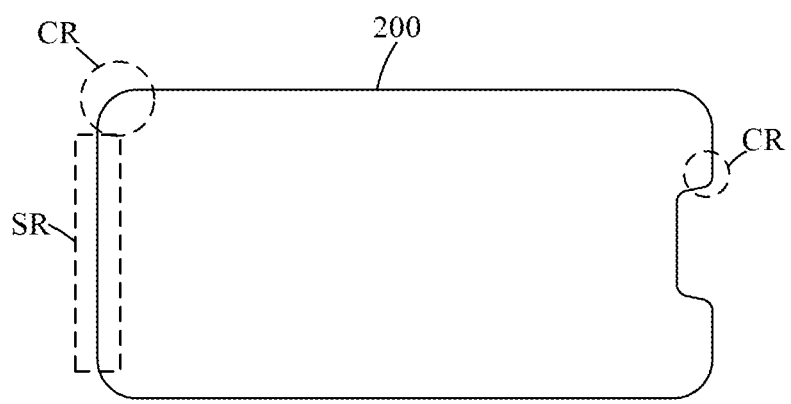
FIG. 2 is a schematic diagram illustrating an existing special-shaped screen.
Figure 3:
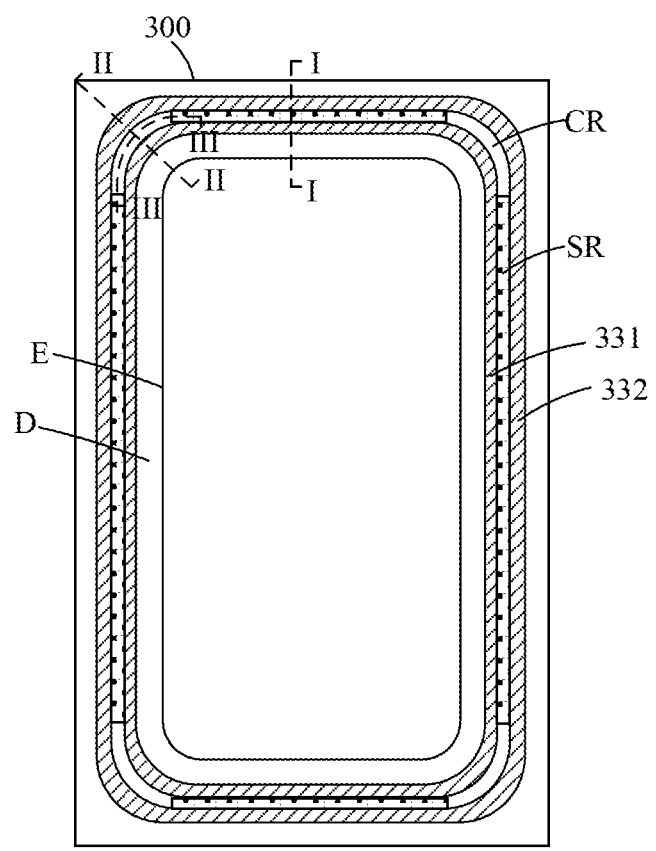
FIG. 3 is a schematic diagram showing an OLED display panel according to the present application.
Figure 4:
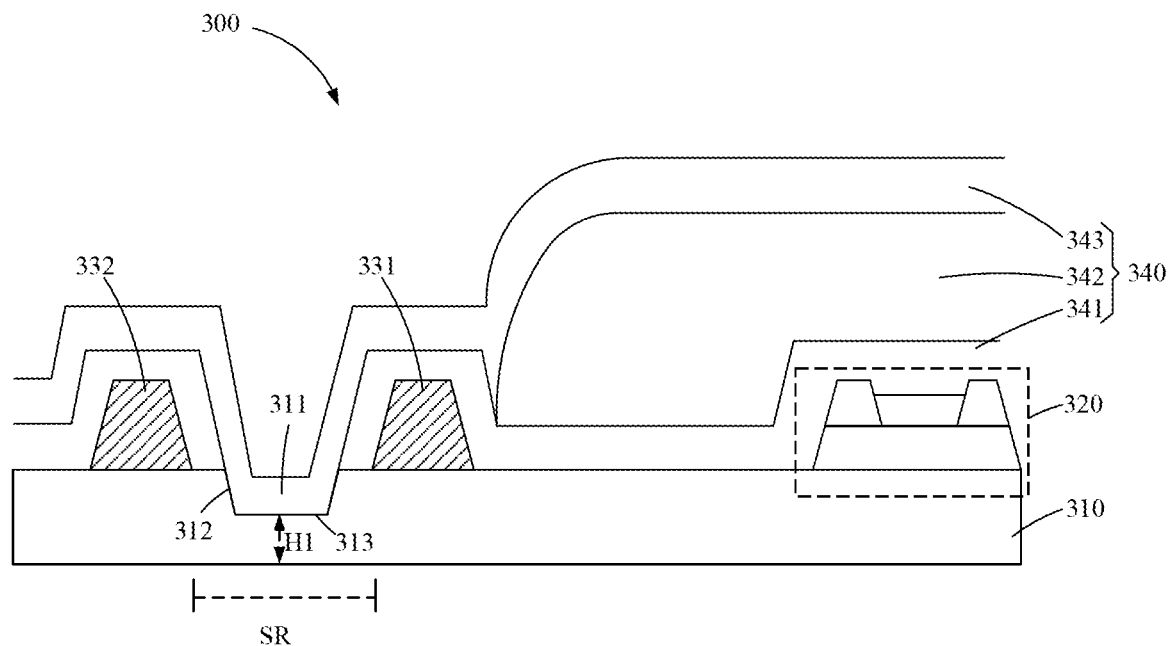
FIG. 4 is a sectional view of FIG. 3 along I-I.
Figure 5:
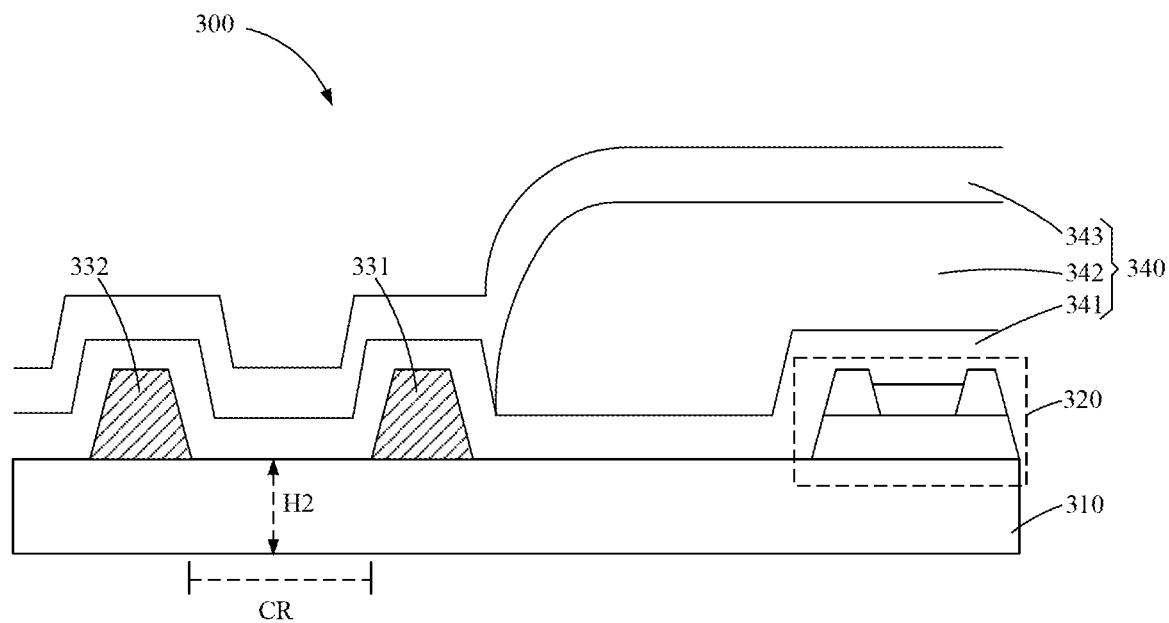
FIG. 5 is a sectional view of FIG. 3 along II-II.
Figure 6:
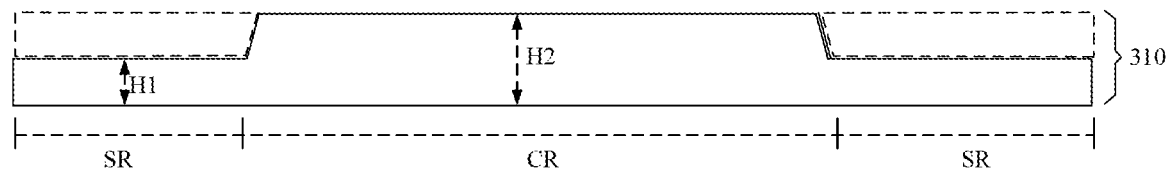
FIG. 6 is a sectional view of FIG. 3 along III-III.

FIG. 3 is a schematic diagram showing an organic light emitting diode (OLED) display panel 300 according to the present application. FIG. 4 is a sectional view of FIG. 3 along I-I. FIG. 5 is a sectional view of FIG. 3 along II-II. FIG. 6 is a sectional view of FIG. 3 along III-III.

The OLED display panel 300 includes a non-display region D and a display region E. The display region E is an effective display region. The display region E has a plurality of pixels (not shown) formed by interlacing a plurality of scan lines (not shown) with a plurality of data lines (not shown), and is configured to display images. The non-display region D surrounds the display region E. The non-display region D is configured to be disposed with a display chip (not shown) and a peripheral wiring region (not shown), for example.

The OLED display panel 300 includes a thin-film transistor (TFT) array substrate 310, a plurality of organic light emitting units 320 disposed in the display region E, a first barrier 331 and a second barrier 3320 disposed in the non-display region D, and a thin film packaging structure 340.

The TFT array substrate 310 includes a plurality of TFTs (not shown) in the display region E, and is configured to drive the organic light emitting units 320. Each TFT includes a gate electrode, a source electrode, and a drain electrode. The plural organic light emitting units 320 are disposed on the TFT array substrate 310 (only one organic light emitting unit 320 is shown in FIGS. 5 and 6). Each organic light emitting unit 320 includes an anode, a cathode, and a organic light emitting layer disposed between the anode and the cathode. In some embodiments, the gate electrode of the TFT is connected to the scan line, the source electrode is connected to the data line, the drain electrode is connected to the anode of the organic light emitting unit 320, and the organic light emitting unit 320 is driven actively.

The TFT array substrate 310 has an insulating layer stacked structure in the non-display region D. The insulating layer stacked structure includes a plurality of overlapped insulating layers (see FIGS. 7, 9, and 11). The first barrier 331 and the second barrier 332 are disposed on the TFT array substrate 310 and located in the non-display region D. That is, the first barrier 331 and the second barrier 332 are disposed on a top-most layer of the TFT array substrate 310 in the non-display region D. The first barrier 331 surrounds the display region E. The second barrier 332 surrounds the first barrier 331. The first barrier 331 and the second barrier 332 are distanced away from each other. The first barrier 331 and the second barrier 332 are protruding structures, and a gap is formed therebetween.

The thin film packaging structure 340 has one or more organic layers and one or more inorganic layers that are overlapped. The organic layers primarily serves to give flexibility to the OLED display panel 300. The inorganic layers primarily serves to prevent oxygen and moisture from per leafing the OLED display panel 300. The number of the organic layers and the inorganic layers of the thin film packaging structure 340 may be adjusted as need. In an embodiment, the thin film packaging structure 340 includes a first inorganic layer 341, an organic layer 342, and a second inorganic layer 343. The organic layer 342 covers the organic light emitting units 320 in the display region E. The first inorganic layer 341 and the second inorganic layer 343 extends to the non-display region D and covers the first barrier 331 and the second barrier 332.

The first barrier 331 is primarily configured to define boundary of the organic layer 342. The organic layer 342 is formed by curing monomers
 due to exposure to ultraviolet light after depositing
 the monomers using a flash evaporation method. The second barrier 332 is primarily configured to prevent the monomers from being deposited in a region where the deposition is not desired during forming the organic layer 342. This may cause adhesion to decrease and oxygen and moisture to permeate from outside.

The first barrier 331 and the second barrier 332 may be manufactured using general processes. Materials of the first barrier 331 and the second barrier 332 may be the same or may be different from each other. Materials for forming the first barrier 331 and the second barrier 332 may include a material selected from an organic material such as a photoresist, a polyacryl-based resin, a polyimide based resin, and an acryl-based resin, or an inorganic material such as a silicon compound.

The thin film packaging structure 340 may be manufactured using general processes. Materials of the first inorganic layer 341 and the second inorganic layer 343 may be the same or may be different from each other. Materials for forming the first inorganic layer 341 and the second inorganic layer 343 may include silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride (SiON). Material for forming the organic layer 342 may include an acrylic resin, a methacrylic resin, polyisoprene, a vinyl resin, an epoxy resin, a urethane resin, a cellulose resin, a perylene resin, and other polymer materials.

The first barrier 331 and the second barrier 332 construct a ring structure such as a closed ring structure. Specifically, the first barrier 331 includes a first closed ring structure, the second barrier 332 includes a second closed ring structure, and the first closed ring structure is disposed inside the second closed ring structure. That is, the area encompassed by the second closed ring structure is larger than the area encompassed by the first closed ring structure. The aforesaid gap is located between the first closed ring structure and the second closed ring structure.

A straight-edge region SR and a corner region CR is defined on the ring structure constructed by the first barrier 331 and the second barrier 332, as shown in FIG. 3. The straight-edge region SR corresponds to straight edges of the display region E and the corner region CR corresponds to corners of the display region E. The corner region CR corresponds to angled lines or curved lines, or both of them.

Between the first barrier 331 and the second barrier 332, a trench 311 is disposed in the straight-edge region SR of the ring structure. That is, the trench 331 is disposed between the first closed ring structure and the second closed ring structure in the straight-edge region SR. The trench 311 is formed by excavating the TFT array substrate 310 in the straight-edge region SR at the position of the gap between the two barriers 331 and 332. After excavated, the trench 311 has an exposed opening.

Specifically, by means of photoresist coating, exposure, developing, and etching processes, the trench 311 is formed by removing a top-most insulating layer or several insulating layers counting from the top, in the straight-edge region SR, of the insulating layer stacked structure of the TFT array substrate 310. That is, at leas one insulating layer is removed to form the trench 311.

The TFT array substrate 310 may be manufactured using general processes. Materials for forming the insulating layers of the insulating layer stacked structure of the TFT array substrate 310 may include a photoresist, an acrylic polymer, a polyimide polymer, a polyamide polymer, a siloxane polymer, a polymer containing a photosensitive acryl carboxyl group, aovolac resin, or an alkali developable resin. Materials for forming the insulating layers of the insulating layer stacked structure of the TFT array substrate 310 may also include an inorganic material such as a silicon compound, metal, or metal oxide, for example, silicon oxide (SiOx), silicon nitride (SiNx), silicon oxynitride (SiOxNy), silicon oxycarbide (SiOxCy), silicon carbonitride (SiCXNy), aluminum (Al), magnesium (Mg), Zinc (Zn), hafnium (Hf), Zirconium (Zr), titanium (Ti), tantalum (Ta), aluminum oxide (AlOx), titanium oxide (TiOx), tantalum oxide (TaOx), magnesium oxide (Mg0x), zinc oxide (ZnOx), hafnium oxide (HfOx), zirconium oxide (ZrOx), and titanium oxide (TiOx).

Specifically, the trench 311 includes a side wall 312 and a bottom wall 313. In an embodiment, a part of a top-most insulating layer of the insulating layer stacked structure of the TFT array substrate 310 in the straight-edge region SR may be removed such that both of the side wall 312 and the bottom wall 313 of the trench 311 are adjacent to the top-most insulating layer. That is, the side wall 312 and the bottom wall 313 are adjacent to a same insulating layer. In another embodiment, a top-most insulating layer or several insulating layers counting from the top, of the insulating layer stacked structure of the TFT array substrate 310 in the straight-edge region SR are removed such that the side wall 312 of the trench 311 is adjacent to one insulating layer of the plural insulating layers and the bottom wall 313 of the trench 311 is adjacent to another insulating layer of the plural insulating layers. That is, the side wall 312 and the bottom wall 313 are adjacent to different insulating layers. In still another embodiment, a bottom-most insulating layer of several insulating layers counting from the top may be partially removed.

The thin film packaging structure 340 covers the TFT array substrate 310, the organic light emitting units 320, the first barrier 331, the second barrier 332, and the exposed opening of the trench 311 disposed in the straight-edge region SR of the ring structure.

As shown in FIGS. 4-6, especially in FIG. 6, the trench 311 (i.e., the region encompassed by the dashed lines in FIG. 6) is disposed in the straight-edge region SR on the TFT array substrate 310. No trench is disposed in the corner region CR on the TFT array substrate 310. Since a region of the TFT array substrate 310 corresponding to the straight-edge region SR is excavated while a region of the TFT array substrate 310 corresponding to the corner region CR is not excavated, a height HI of the TFT array substrate 310 in the straight-edge region SR is lower than a height H2 of the TFT array substrate 310 in the corner region CR. In some embodiments, the TFT array substrate 310 in both of the straight-edge region SR and the corner region CR may be excavated as long as the height of the TFT array substrate 310 in the straight-edge region SR is lower than the height of the TFT array substrate 310 in the corner region CR.

A profile of the corner region CR is of great complexity. For the thin film packaging structure 340, adhesion in the corner region CR is worse than in the straight-edge region SR. The thin film packaging structure 340 is easy to peel off in the corner region CR such that the organic layer 342 of the thin film packaging structure 340 is easy to overflow from the corner region CR. Special-shaped screens have much more corner regions CR and this situation occurs more easily for the special-shaped screens. In the present application, the trench 311 is disposed in the straight-edge region SR on the TFT array substrate 310 at the position of the gap between the two barriers 331 and 332. This makes the height HI of the TFT array substrate 310 in the straight-edge region SR lower than the height H2 of the TFT array substrate 310 in the corner region CR. That is, a height difference of the TFT array substrate 310 is formed between the straight-edge region SR and the corner region CR. When the organic layer 342 of the thin film packaging structure 340 overflows from the corner region CR to a region between the two barriers 331 and 332, the overflowed portion may be distributed to the straight-edge region SR with low height due to the height difference. Accordingly, the present application can efficiently lower the risk of overflow from the corner region CR to the outside for the organic layer 342 of the thin film packaging structure 340.

Figure 7:
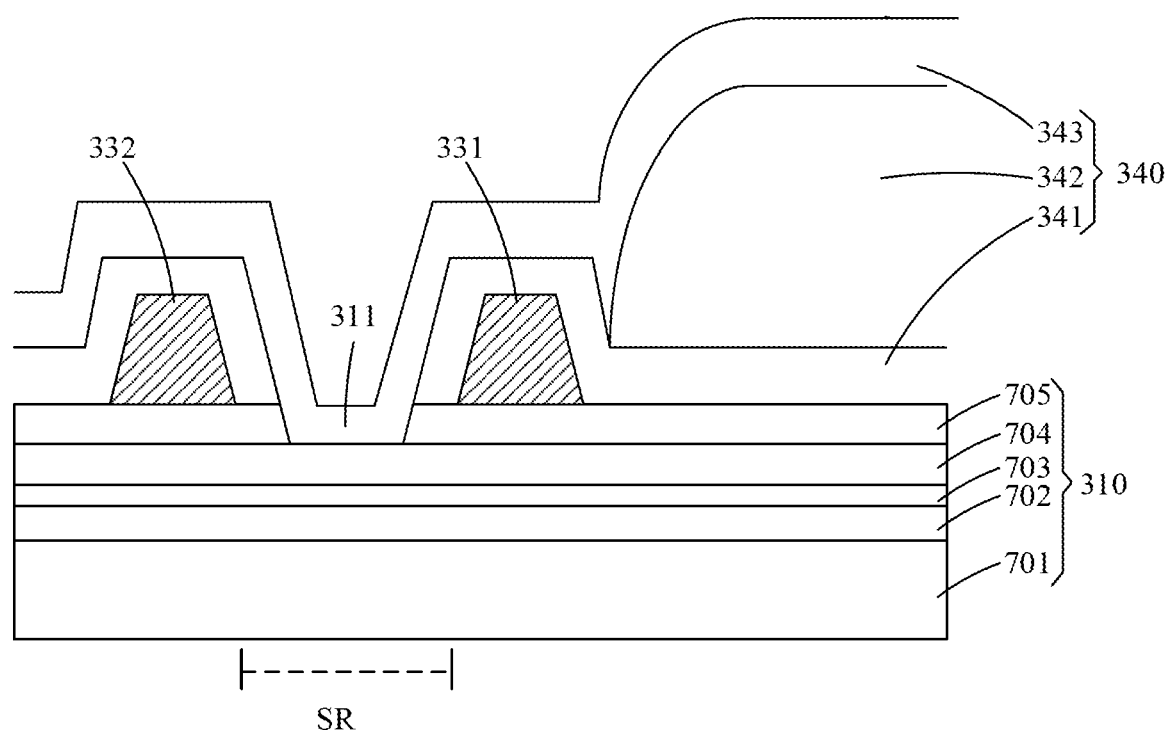
FIG. 7 is a schematic diagram showing an OLED display panel according to an embodiment of the present application.
Figure 8:
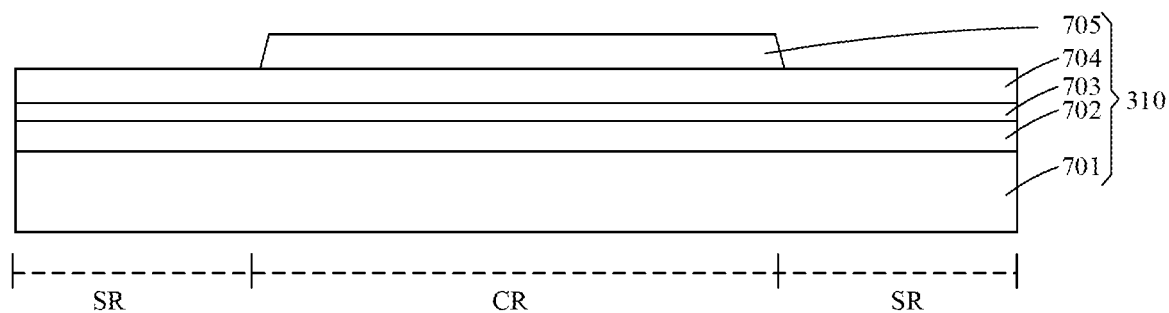
FIG. 8 is a schematic diagram showing a cross section taken along a gap between two barriers according to an embodiment of the present application.

FIG. 7 is a schematic diagram showing an OLED display panel according to an embodiment of the present application. FIG. 8 is a schematic diagram showing a cross section taken along a gap between two barriers 331 and 332 according to an embodiment of the present application. In the non-display region D, the plural insulating layers contained in the insulating layer stacked structure of the TFT array substrate 310 includes a substrate 701, a buffer layer 702, a gate insulating layer 703, a first insulating interlayer 704, and a second insulating interlayer 705, in order from bottom to top. The material of the substrate 701 is glass or plastic. The buffer layer 702 is an optional structure. The second insulating interlayer 705 is the outermost insulation layer of the insulating layer stacked structure.

When deposition of the second insulating interlayer 705 is completed, the second insulating interlayer 705 in the straight-edge region SR in the gap between the two barriers 331 and 332 is excavated to form the trench 311 by means of photoresist coating, exposure, developing, and etching processes. The structure of the gap is formed as shown in FIG. 8. That is, the trench 311 is formed by excavating the second insulating interlayer 705. In this embodiment, a depth of the trench 311 is equal to a thickness of the second insulating interlayer 705. After forming the trench 311, deposition of the organic light emitting units 320, the two barriers 331 and 332, and the thin film packaging structure 340 is then conducted.

Figure 9:
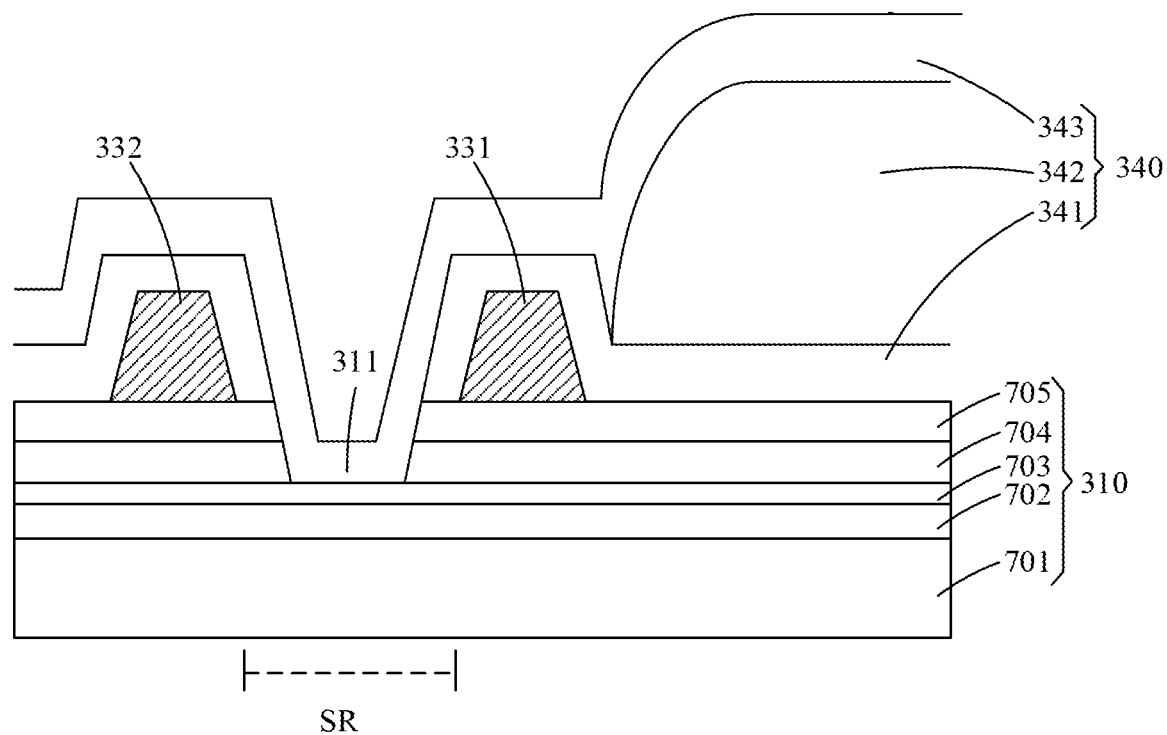
FIG. 9 is a schematic diagram showing an OLED display panel according to another embodiment of the present application.
Figure 10:
FIG. 10 is a schematic diagram showing a cross section taken along a gap between two barriers according to another embodiment of the present application.

FIG. 9 is a schematic diagram showing an OLED display panel according to another embodiment of the present application. FIG. 10 is a schematic diagram showing a cross section taken along a gap between two barriers 331 and 332 according to another embodiment of the present application. Compared to the embodiment of FIGS. 7 and 8, in this embodiment, when deposition of the second insulating interlayer 705 is completed, the second insulating interlayer 705 and the first insulating interlayer 704 in the straight-edge region SR in the gap between the two barriers 331 and 332 are excavated to form the trench 311 by means of photoresist coating, exposure, developing, and etching processes. The structure of the gap is formed as shown in FIG. 10. That is, the trench 311 is formed by excavating the second insulating interlayer 705 and the first insulating interlayer 704. In this embodiment, a depth of the trench 311 is equal to a total thickness of the first insulating interlayer 704 and the second insulating interlayer 705.

Figure 11:
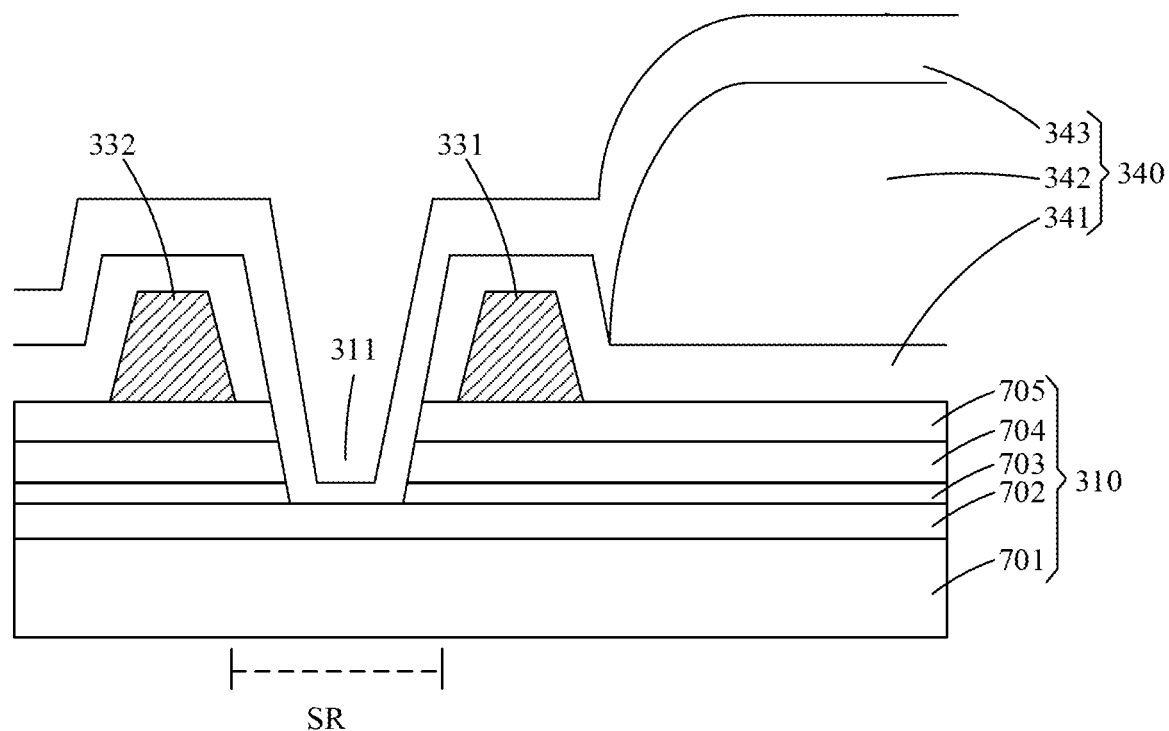
FIG. 11 is a schematic diagram showing an OLED display panel according to yet another embodiment of the present application.
Figure 12:
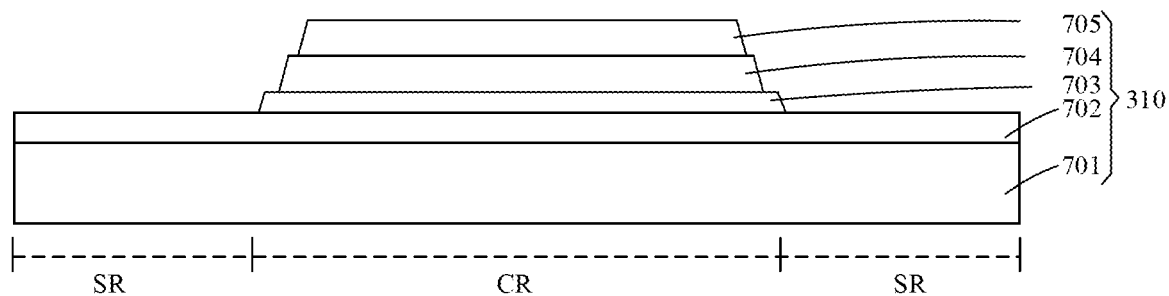
FIG. 12 is a schematic diagram showing a cross section taken along a gap between two barriers according to yet another embodiment of the present application.

FIG. 11 is a schematic diagram showing an OLED display panel according to yet another embodiment of the present application. FIG. 12 is a schematic diagram showing a cross section taken along a gap between two barriers 331 and 332 according to yet another embodiment of the present application. Compared to the embodiment of FIGS. 7 and 8, in this embodiment, when deposition of the second insulating interlayer 705 is completed, the second insulating interlayer 705, the first insulating interlayer 704, and the gate insulating layer 703 in the straight-edge region SR in the gap between the two barriers 331 and 332 are excavated to form the trench 311 by means of photoresist coating, exposure, developing, and etching processes. The structure of the gap is formed as shown in FIG. 12. That is, the trench 311 is formed by excavating the second insulating interlayer 705, the first insulating interlayer 704, and the gate insulating layer 703. In this embodiment, a depth of the trench 311 is equal to a total thickness of the gate insulating layer 703, the first insulating interlayer 704, and the second insulating interlayer 705.

Figure 13:
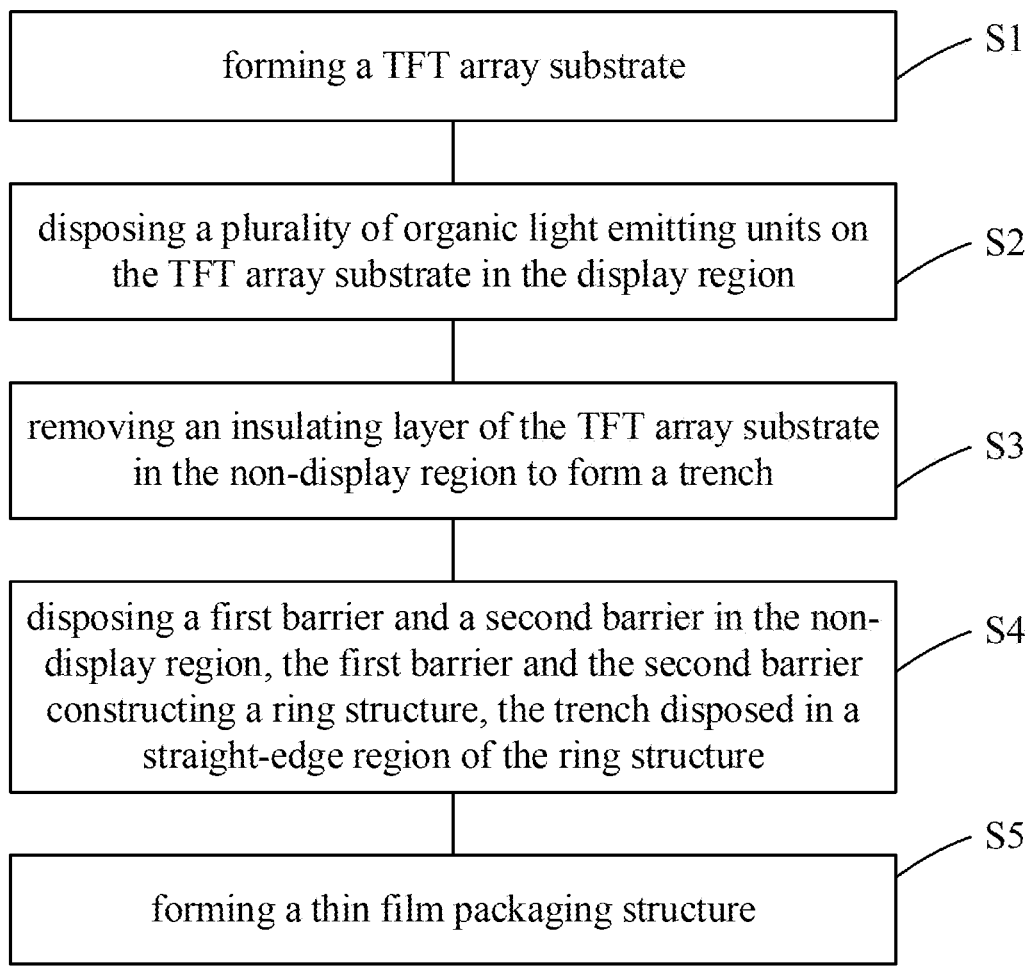
FIG. 13 is a flowchart of a method for manufacturing an OLED display panel according to the present application.

FIG. 13 is a flowchart of a method for manufacturing an OLED display panel according to the present application. As described above, the display panel 300 includes a display region E and a non-display region D. The display region E is configured to display images. The non-display region D surrounds the display region E. Referring to FIG. 13 with reference to FIGS. 3 to 12, the method for manufacturing the OLED display panel according to the present application includes the following steps.

Step S1: forming a TFT array substrate. Specifically, the TFT array substrate 310 is formed. The TFT array substrate 310 includes an insulating layer stacked structure in the non-display region D. The insulating layer stacked structure includes a plurality of overlapped insulating layers such as the buffer layer 702, the gate insulating layer 703, the first insulating interlayer 704, and the second insulating interlayer 705. The TFT array substrate 310 may be manufactured using general processes.

Step S2: disposing a plurality of organic light emitting units on the TFT array substrate in the display region. Specifically, a plurality of organic light emitting units 310 are disposed on the TFT array substrate 310 in the display region E. The organic light emitting unit 320 may include an anode, an organic light emitting layer, and a cathode from top to bottom.

Step S3: removing an insulating layer of the TFT array substrate in the non-display region to form a trench. Specifically, at least one of the plural insulating layers contained in the insulating layer stacked structure of the TFT array substrate 310 in the non-display region D is removed to form a trench 311. The trench 311 has an exposed opening. By means of photoresist coating, exposure, developing, and etching processes, the trench 311 is formed by removing a top-most insulating layer or several insulating layers counting from the top, in the straight-edge region SR, of the insulating layer stacked structure of the TFT array substrate 310. For example, the trench 311 is formed by removing the second insulating interlayer 705. For example, the trench 311 is formed by removing the second insulating interlayer 705 and the first insulating interlayer 704. For example, the trench 311 is formed by removing the second insulating interlayer 705, the first insulating interlayer 704, and the gate insulating layer 703. The order of Steps S2 and S3 and be reversed.

Step S4: disposing a first barrier and a second barrier in the non-display region, the first barrier and the second barrier constructing a ring structure, the trench disposed in a straight-edge region of the ring structure. Specifically, a first barrier 331 and a second barrier 332 are disposed in the non-display region D on the TFT array substrate 310. The first barrier 331 and the second barrier 332 may be manufactured using general processes. The first barrier 331 and the second barrier 332 construct the ring structure. A straight-edge region SR and a corner region CR are defined on the ring structure. The trench 311 is disposed in the straight-edge region SR of the ring structure and located between the first barrier 331 and the second barrier 332.

Step S5: forming a thin film packaging structure. Specifically, a thin film packaging structure 340 having one or more organic layers and one or more inorganic layers that are overlapped is formed to cover the TFT array substrate 310, the organic light emitting units 320, the first barrier 331, the second barrier 332, and the exposed opening of the trench 311 disposed in the straight-edge region SR of the ring structure. The thin film packaging structure may be manufactured using general processes.

In the method for manufacturing the OLED display panel according to the present application, a height H1 of the TFT array substrate 310 in the straight-edge region SR is lower than a height of the TFT array substrate 310 in the corner region CR. When the organic layer 342 of the thin film packaging structure 340 overflows from the corner region CR to a region between the two barriers 331 and 332, the overflowed portion may be distributed to the straight-edge region SR with low height due to the height difference, to lower the risk of direct overflow of the organic layer 342.

Other details of the method for manufacturing the OLED display panel according to the present application may be referred to the description of the OLED display panel in above context, and are not repeated herein.

Above all, while the preferred embodiments of the present application have been illustrated and described in detail, it is intended that the present application should not be limited to the preferred embodiment. Various modifications and alterations which maintain the realm of the present application can be made by persons skilled in this art. The protective scope of the present application is subject to the scope as defined in the claims.

The invention claimed is:
1. An organic light emitting diode (OLED) display panel, including a display region and a non-display region, the display region configured to display images, the non-display region surrounding the display region, the display panel comprising:
- a thin-film transistor (TFT) array substrate, comprising an insulating layer stacked structure in the non-display region, the insulating layer stacked structure comprising a plurality of overlapped insulating layers;
- a plurality of organic light emitting units, disposed on the TFT array substrate and located in the display region;
- a first barrier, disposed on the TFT array substrate, the first barrier located in the non-display region and surrounding the display region;
- a second barrier, disposed on the TFT array substrate, the second barrier located in the non-display region and surrounding the first barrier, the first barrier and the second barrier distanced away from each other, the first barrier comprising a first closed ring structure, the second barrier comprising a second closed ring structure, the first closed ring structure disposed inside the second closed ring structure, the first barrier and the second barrier constructing a ring structure, a straight-edge region and a corner region defined on the ring structure;
- a trench, disposed in the straight-edge region of the ring structure and between the first closed ring structure and the second closed ring structure, the trench disposed in the insulating layer stacked structure of the TFT array substrate and having an exposed opening, a height of the TFT array substrate in the straight-edge region lower than a height of the TFT array substrate in the corner region; and
- a thin film packaging structure, having one or more organic layers and one or more inorganic layers that are overlapped, the thin film packaging structure covering the TFT array substrate, the plural organic light emitting units, the first barrier, the second barrier, and the exposed opening of the trench in the straight-edge region disposed on the ring structure.

2. The display panel according to claim 1, wherein the plural insulating layers contained in the insulating layer stacked structure of the TFT array substrate sequentially comprise a gate insulating layer, a first insulating interlayer, and a second insulating interlayer, and the second insulating interlayer is a outmost insulating layer of the insulating layer stacked structure.

3. The display panel according to claim 2, wherein a depth of the trench is equal to a thickness of the second insulating interlayer.

4. The display panel according to claim 2, wherein a depth of the trench is equal to a total thickness of the first insulating interlayer and the second insulating interlayer.

5. The display panel according to claim 2, wherein a depth of the trench is equal to a total thickness of the gate insulating layer, the first insulating interlayer, and the second insulating interlayer.

6. An organic light emitting diode (OLED) display panel, comprising a display region and a non-display region, the display region configured to display images, the non-display region surrounding the display region, the display panel comprising:
- a thin-film transistor (TFT) array substrate, comprising an insulating layer stacked structure in the non-display region, the insulating layer stacked structure comprising a plurality of overlapped insulating layers;
- a plurality of organic light emitting units, disposed on the TFT array substrate and located in the display region;
- a first barrier, disposed on the TFT array substrate, the first barrier located in the non-display region and surrounding the display region;
- a second barrier, disposed on the TFT array substrate, the second barrier located in the non-display region and surrounding the first barrier, the first barrier and the second barrier distanced away from each other, the first barrier and the second barrier constructing a ring structure, a straight-edge region and a corner region defined on the ring structure;
- a trench, disposed in the straight-edge region of the ring structure and located between the first barrier and second barrier, the trench disposed in the insulating layer stacked structure of the TFT array substrate and having an exposed opening; and
- a thin film packaging structure, having one or more organic layers and one or more inorganic layers that are overlapped, the thin film packaging structure covering the TFT array substrate, the plural organic light emitting units, the first barrier, the second barrier, and the exposed opening of the trench in the straight-edge region disposed on the ring structure.

7. The display panel according to claim 6, wherein the first barrier comprises a first closed ring structure, the second barrier comprises a second closed ring structure, the first closed ring structure is disposed inside the second closed ring structure, the trench is disposed between the first closed ring structure and the second closed ring structure.

8. The display panel according to claim 6, wherein a height of the TFT array substrate in the straight-edge region is lower than a height of the TFT array substrate in the corner region.

9. The display panel according to claim 6, wherein the trench has a side wall and a bottom wall, the side wall and the bottom wall of the trench are adjacent to at least one of the plural insulating layers of the insulating layer stacked structure.

10. The display panel according to claim 6, wherein the trench has a side wall and a bottom wall, the side wall of the trench is adjacent to one of the plural insulating layers of the insulating layer stacked structure and the bottom wall of the trench is adjacent to another one of the plural insulating layers of the insulating layer stacked structure.

11. The display panel according to claim 6, wherein the plural insulating layers contained in the insulating layer stacked structure of the TFT array substrate sequentially comprise a gate insulating layer, a first insulating interlayer, and a second insulating interlayer, and the second insulating interlayer is a outmost insulating layer of the insulating layer stacked structure.

12. The display panel according to claim 11, wherein a depth of the trench is equal to a thickness of the second insulating interlayer.

13. The display panel according to claim 11, wherein a depth of the trench is equal to a total thickness of the first insulating interlayer and the second insulating interlayer.

14. The display panel according to claim 11, wherein a depth of the trench is equal to a total thickness of the gate insulating layer, the first insulating interlayer, and the second insulating interlayer.

* * * * *